United States Patent [19]

Neese et al.

[11] Patent Number: 4,555,151

[45] Date of Patent: Nov. 26, 1985

[54] CONTACT TERMINAL DEVICE FOR CONNECTING HYBRID CIRCUIT MODULES TO A PRINTED CIRCUIT BOARD

[75] Inventors: Wayne E. Neese, Hoffman Estates; William E. Stepan, Clarendon Hills, both of Ill.

[73] Assignee: GTE Communication Systems Corporation, Phoenix, Ariz.

[21] Appl. No.: 638,174

[22] Filed: Aug. 6, 1984

[51] Int. Cl.[4] .......................................... H01R 23/72
[52] U.S. Cl. ............................ 339/17 CF; 339/258 R
[58] Field of Search ............ 339/17 M, 17 LM, 17 L, 339/17 CF, 17 N, 176 MP, 258 R, 258 P

[56] References Cited

U.S. PATENT DOCUMENTS

| 4,089,575 | 5/1978 | Grabbe | 339/17 CF |
| 4,192,565 | 3/1980 | Gianni | 339/17 CF |
| 4,384,757 | 5/1983 | Andrews, Jr. et al. | 339/17 M |
| 4,478,476 | 10/1984 | Jones | 339/17 CF |

Primary Examiner—Neil Abrams
Attorney, Agent, or Firm—Anthony Miologos; Peter Ziarhos

[57] ABSTRACT

A device arranged to electrically connect and physically attach a hybrid circuit module to a printed wiring card. The device is characterized by a male terminal section arranged to be mounted on a printed wiring card, a compliant section for buffering any flexure or displacement imparted to the hybrid circuit module and a hybrid circuit module accepting section. Additionally, a terminal accepting section is provided disposed to accept the male terminal section of another similar device, allowing the stacking of a plurality of hybrid circuit modules to the printed wiring card.

4 Claims, 2 Drawing Figures

CONTACT TERMINAL DEVICE FOR CONNECTING HYBRID CIRCUIT MODULES TO A PRINTED CIRCUIT BOARD

BACKGROUND OF THE INVENTION

This invention relates in general to terminal devices and, more particularly, to a stackable contact terminal device arranged to terminate thick/thin film hybrid circuit modules to printed wiring cards.

Contact terminals are widely used in the electronics industry to terminate or provide an electrical path between thick/thin film hybrid circuits and printed circuit boards or other types of electrical interconnection mediums. Normally, a male section of a terminal is inserted into component holes on a printed circuit board and an edge of a hybrid circuit module installed at a U-shaped section which extends from the male section of the terminal.

The disadvantages of the presently used terminals is the susceptibility to fracture of the thick/thin film substrate and solder connections as a result of its rigid design. The rigidity of the terminal transforms flexing and other stress-inducing actions to the thick/thin film substrate. These stresses sometimes exceed the ultimate strength of the substrate material, resulting in a fracture and obvious destruction of the circuit. A further disadvantage of the terminals, presently known, is their inability to interconnect with each other, thereby not allowing additional circuits to be inserted and connected to a previously installed initial assembly.

Applicant's device overcomes these aforementioned disadvantages by providing for a terminal device which absorbs any thermal or shock stresses. Additionally, a stackable feature of the invention allows circuits to be stacked one on top of the other, thus creating layered or stacked thick/thin film hybrid circuit assemblies.

It is therefore the object of the present invention to provide a stackable contact terminal device for absorbing stresses between a printed wiring card and a hybrid circuit module and an arrangement for interconnecting a plurality of terminals together forming stackable hybrid module assemblies.

SUMMARY OF THE INVENTION

In accomplishing the object of the present invention, there is provided a contact terminal device for electrically interconnecting, and physically attaching hybrid circuit modules to a printed circuit board and a source of electrical signals. The contact terminal device includes male terminal means, arranged to be accepted and electrically connected to the printed circuit board and to the source of electrical signals. The male terminal means further includes buffer means having one leg extending perpendicularly from one end of the male terminal means. Accepting means extending from a second leg of the buffer means forms a compliant mouth for accepting an edge of a hybrid circuit module, thereby electrically connecting the hybrid circuit module to the printed circuit board and the source of electrical signals.

Connecting means extending from the accepting means is arranged to accommodate the male terminal means of a second contact terminal device interconnecting and physically attaching a second hybrid circuit module to the printed circuit board and to the source of electrical signals.

DESCRIPTION OF THE PREFERRED EMBODIMENT

Figure 1:
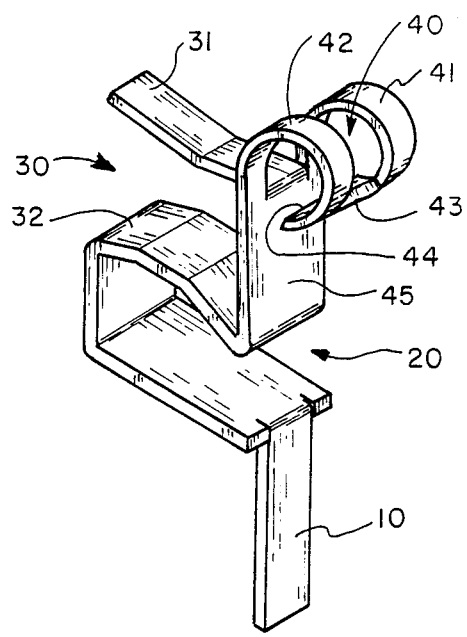
FIG. 1 is a perspective view of the Contact Terminal Device of the present invention.

Turning now to FIG. 1, the substrate terminal of the present invention is illustrated. The terminal is characterized by four major sections, defined generally as the male terminal section 10, the compliant section 20, the substrate accepting section 30, and the terminal accepting section 40.

The male terminal section 10 forms a vertically oriented strip disposed to be accepted within component mounting holes of printed circuit boards or inserted into the terminal accepting portion 40 of another similar device.

The compliant section 20 is generally U-shaped in configuration, extending 90 degrees from one edge of the male terminal portion 10. The compliant section buffers any flexure or displacement of the printed circuit board relative to an installed ceramic substrate and thus prevents the full induction of forces to the ceramic substrate material.

The substrate accepting section 30 is comprised of an upper tongue 31 and a lower body 32. The upper tongue 31 and lower body 32 are formed and spaced to accept an edge of a thick or thin film ceramic substrates therebetween. It should be noted that tongue 31 is compliant to the insertion of the substrate edge and therefore provides good electrical contact to included contact pads normally found on the edge of the ceramic substrate circuit.

The terminal accepting section 40 comprises loops 41, 42 and a flange 43, situated between loops 41, 42. An edge 44 of flange 43 defines an opening between edge 44 and surface 45, a distance which is less than the thickness of the male terminal portion 10. The opening thus defined, allows the insertion of a second terminal device by inserting the second device's male terminal portion 10 between loops 41, 42 and through the opening defined by flange 43 and surface 45. Edge 44 applies a compressive force against male terminal portion 10, thereby keeping the second terminal in place and providing an electroconductive path through the second terminal device.

It should be noted that the terminal device just described is formed from a single stamping of a phospur bronze material which is finished in a 60/40 tin lead electroplate. The stamping is then formed into the shape thus shown.

Figure 2:
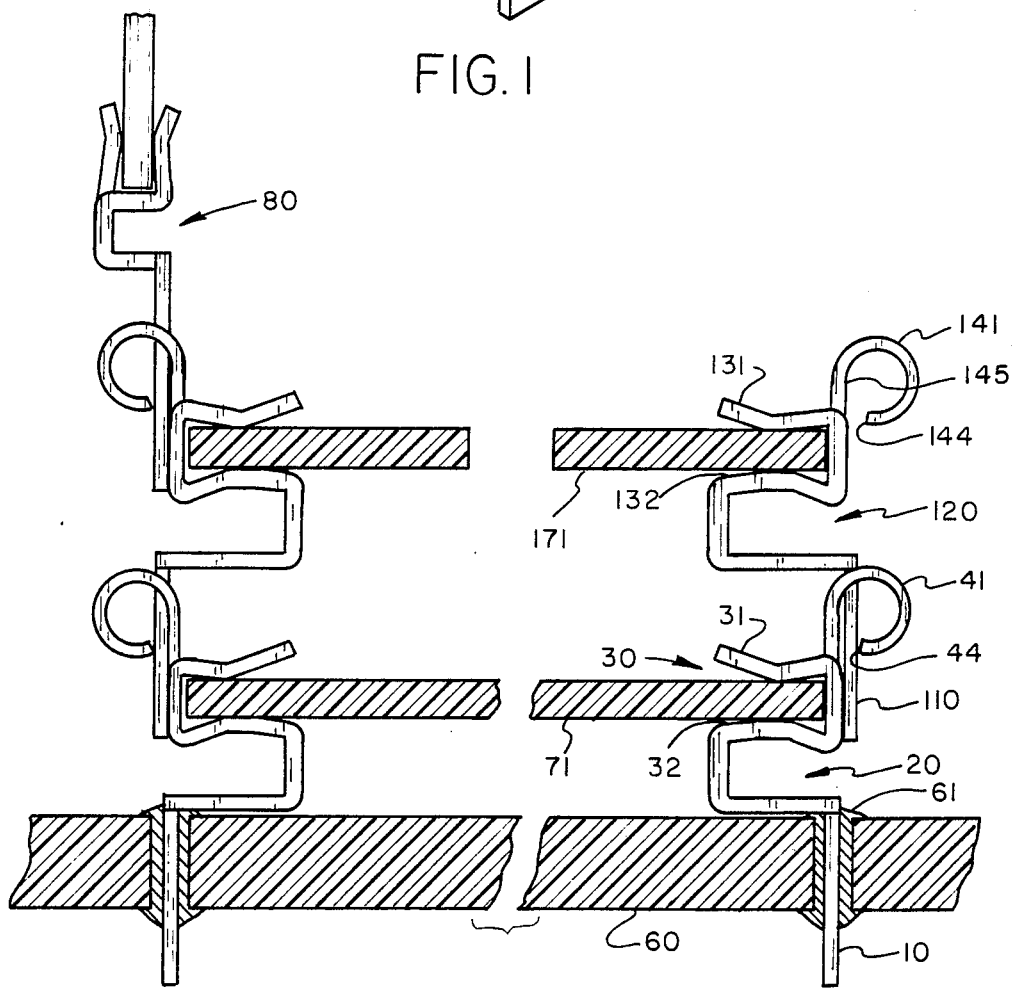
FIG. 2 is an elevational view of the Contact Terminal Device as would be used in a hybrid circuit module assembly.

Turning now to FIG. 2, the application of the terminal of the present invention is shown. As can be seen, the first set of devices forming the first level of interconnection between a printed circuit card 60 and a hybrid circuit module 70 includes the insertion of the male terminal portion 10 into holes 61 formed on a printed wiring card. The male terminal portion is inserted into a respective hole 61 until the U-shaped compliant section rests on the top surface of printed wiring card 60. Hole 61 is then filled with solder, whereby the male terminal portion 10 is fixedly retained to the printed circuit card 60.

It should be noted that in a normal configuration, a plurality of terminal devices are used to make the interconnections between the printed wiring card and the hybrid circuit module. And only two are shown here for matters of clarity.

After the soldering of male terminal section 10 to printed wiring card 60, the hybrid circuit module 70 is installed by press fitting the edges of the module into the substrate accepting section 30 between tongue 31 and lower body 32. Tongue 31 applies a compressive force to the upper edge of the hybrid circuit module 70 contacting a conductive pad on the hybrid circuit module normally associated with this type of a connection. As explained earlier, compliant section 20 buffers any displacement of the printed circuit board relative to the ceramic substrate, thus preventing the induction of forces to the substrate material, and preventing any fracturing of the ceramic substrate or solder connections.

A second hybrid circuit module 171 or a segmented portion of a hybrid circuit module may be added to the already installed hybrid circuit assembly by adding additional terminal devices to the terminal accepting portion 40 of the installed terminal devices. As can be seen in FIG. 2, the terminal male portion 110 of the second terminal is inserted into the terminal accepting portion 40 of the first terminal, allowing edge 44 to exert a compressive force on terminal section 110, thereby keeping it in place. It should be noted that solder may also be used to make a permanent electroconductive connection between the first and second terminals. The hybrid circuit module 171 is then inserted between tongue 131 and lower body 132 of the second terminal device, electrically connecting the now two hybrid circuit modules 171 and 70 to the printed wiring card 60. As can be well understood by those skilled in the art that the stacking of additional hybrid circuit modules assemblies may be accomplished by the same procedure outlined above. This can be accomplished by using the same terminal devices disclosed by the invention or a single in-line package terminal device shown generally as 80.

Although the preferred embodiment of the invention has been illustrated, and that form described in detail, it will be readily apparent to those skilled in the art that various modifications may be made therein without departing from the spirit of the invention or from the scope of the appended claims.

What is claimed:

1. A contact terminal device for electrically interconnecting and physically attaching at least first and second planar hybrid circuit modules in a stacked and substantially parallel relationship to the other and to a printed circuit board connected to a source of electrical signals, said contact terminal device comprising:
    male terminal means arranged to be accepted and electrically connected to said printed circuit board and said source of electrical signals;
    a buffer means including first and second legs and having said first leg extending from said male terminal means;
    accepting means including a resilient tongue section and a rigid vertically oriented surface extending from said buffer means second leg forming a compliant mouth for accepting an edge of said first hybrid circuit module therein, electrically connecting said first hybrid circuit module to said printed circuit board and said source of electrical signals; and,
    connecting means comprising first and second open-ended loops of conductive material spaced parallel to each other and having one end of each of said first and second loops extending from a top edge of said accepting means surface, each of said first and second loops connected to the other's opposite end by a horizontal member defining a male terminal accepting area between the front edge of said horizontal member and a rear side of said accepting means surface, the male terminal means of a second contact terminal device installed on said second hybrid module is inserted between said first and second loops, and said horizontal member front edge applies a compressive force against said male terminal means of said second terminal device thereby, retaining said second hybrid circuit module to said first hybrid circuit module in a stacked and parallel relationship, connecting said second hybrid module to said printed circuit board and said source of electrical signals.

2. The contact terminal device as claimed in claim 1, wherein; said printed circuit board includes at least one component mounting hole and said male terminal means is comprised of a vertically orientated strip of electrically conductive material arranged to be inserted and electrically interconnected to said component mounting hole.

3. The contact terminal device as claimed in claim 1, wherein; said buffer means is comprised of a U-shaped electrically conductive material having an end of said first leg integrally joined perpendicularly to said terminal means.

4. The contact terminal device as claimed in claim 1, wherein: said accepting means has one end of said vertically oriented surface integrally joined perpendicularly to an end of said buffer means second leg forming said compliant mouth, arranged to accept an edge of a hybrid circuit module between said tongue section and said buffer means second leg.

* * * * *